United States Patent
Sakurai (10) Patent No.: US 7,679,944 B2
(45) Date of Patent: Mar. 16, 2010

(54) MOTOR DRIVE

(75) Inventor: Naoki Sakurai, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 387 days.

(21) Appl. No.: 11/655,207

(22) Filed: Jan. 19, 2007

(65) Prior Publication Data
US 2007/0201254 A1    Aug. 30, 2007

(30) Foreign Application Priority Data
Feb. 28, 2006    (JP) .............................. 2006-053046

(51) Int. Cl.
*H02M 7/5387*    (2007.01)
(52) U.S. Cl. ................ 363/98; 363/56.01; 363/132; 257/361
(58) Field of Classification Search ... 363/56.01–56.05, 363/132, 147, 97, 98; 257/361, 362, 370–373, 257/565
See application file for complete search history.

(56) References Cited
U.S. PATENT DOCUMENTS

| | | | |
|---|---|---|---|
| 6,040,827 A * | 3/2000 | Shiina et al. ................ 345/208 |
| 6,211,706 B1 * | 4/2001 | Choi et al. ................ 327/108 |
| 6,229,196 B1 * | 5/2001 | Shishido et al. ............. 257/617 |
| 6,501,321 B2 * | 12/2002 | Kumagai ..................... 327/333 |
| 6,556,053 B2 * | 4/2003 | Stanley ...................... 327/108 |
| 7,492,618 B2 * | 2/2009 | Matsuda et al. .......... 363/56.05 |
| 2005/0134533 A1 * | 6/2005 | Sasada et al. ................. 345/60 |
| 2005/0274982 A1 * | 12/2005 | Ueda et al. .................. 257/202 |

FOREIGN PATENT DOCUMENTS

JP    2004-304929    10/2004

* cited by examiner

*Primary Examiner*—Jeffrey L Sterrett
*Assistant Examiner*—Fred E Finch, III
(74) *Attorney, Agent, or Firm*—Antonelli, Terry, Stout & Kraus, LLP.

(57) ABSTRACT

To provide a motor drive adapted to operate stably and suffer essentially no damage, even when a high voltage is applied between grounding terminals of upper and lower arms.

The motor drive of this invention includes: an arm with a first electric power semiconductor-switching element and a second electric power semiconductor-switching element, both connected in series between major terminals; and a level-shifting circuit that transmits a control signal of the first semiconductor-switching element connected to the high-voltage side of the arm, from a low-voltage circuit to a high-voltage circuit; the motor drive employing an insulated-gate bipolar transistor as the signal-transmitting high-withstand-voltage element formed in the level-shifting circuit.

12 Claims, 11 Drawing Sheets

FIG. 1

(Prior Art)

FIG. 2

(Prior Art)

FIG. 3

(Prior Art)

FIG. 4

(Prior Art)

MOTOR DRIVE

CLAIM OF PRIORITY

The present application claims priority from Japanese application serial no. 2006-53046, filed on Feb. 28, 2006, the content of which is hereby incorporated by reference into this application.

FIELD OF THE INVENTION

The present invention relates to a motor drive that includes a level-shifting circuit adapted to transmit a control signal from a low-voltage circuit to a high-voltage circuit.

BACKGROUND OF THE INVENTION

Figure 2:
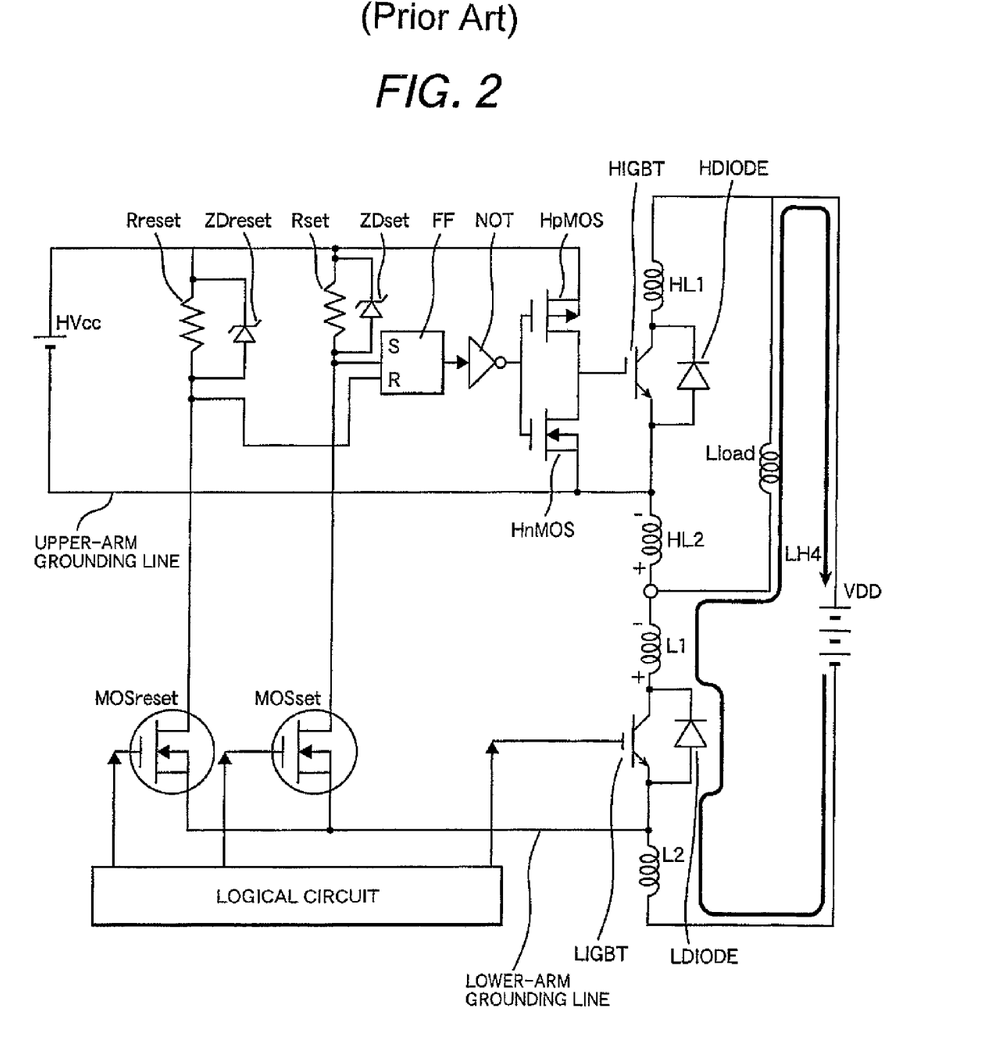
FIG. 2 is a circuit diagram of a motor drive based on the above-described conventional technique.

In recent years, the use of insulated-gate bipolar transistors (IGBTs) or other semiconductor devices to control motors is increasing with a tendency towards lower pricing of the semiconductor devices, especially the IGBTs, in order to save energy. A circuit diagram of a motor drive for one arm of driving based on a conventional technique is shown in FIG. 2. In FIG. 2, the motor that is a load is replaced by an inductance element, which is connected between the high-potential side and output of a main power supply Vdd. The high-voltage terminal of the main power supply Vdd and the collector of an upper-arm IGBT are connected via wiring HL1. The emitter of the upper-arm IGBT and the output terminal of the main power supply Vdd are connected via wiring HL2. The collector of a lower-arm IGBT and the output terminal are connected via wiring L1. The grounding terminal of the main power supply Vdd and the emitter of the lower-arm IGBT are connected via wiring L2. A diode HDIODE is connected in parallel between the collector and emitter of the upper-arm IGBT. Also, a diode LDIODE is connected across the lower-arm IGBT. A load inductance element Lload is connected between the high-voltage terminal and output terminal of the main power supply Vdd. A driving circuit constructed of an HnMOS and an HpMOS is connected to the gate terminal of the upper-arm IGBT.

The upper-arm IGBT111 is connected to the output terminal, so in terms of potential, the upper-arm IGBT is driven in a floating state with respect to the grounding terminal of the main power supply. When the upper-arm IGBT is on, therefore, this IGBT is impressed with the same high voltage as that of the main power supply. Accordingly, the driving circuit 113 requires electrical insulation from the grounding potential of the main power supply. As described in Patent Document 1, the above conventional technique has used a photocoupler 130 to transmit signals to an insulated driving circuit 113. It is also described in Japanese Patent Laid-open No. 2004-304929, paragraphs (0002), (0020), (0021) that a level-shifting circuit is used as a means for sending a driving signal from a lower arm to an upper arm floating in terms of potential.

In FIG. 2, the source of a high-withstand-voltage MOSset for turn-on signal transmission is connected to a lower-arm grounding terminal. The gate of the MOSset is connected to a logical circuit. One end of a resistor Rset is connected to the drain of the MOSset. The other end of the resistor Rset is connected to the high-voltage side of a power supply HVcc for driving the upper arm. A Zener diode Zdset for protection from an overvoltage is connected across the resistor. The source of a MOSset, a high-withstand-voltage MOS for turn-off signal transmission, is connected to the lower-arm grounding terminal. The gate of the MOSreset is connected to the logical circuit. One end of a resistor Rreset is connected to the drain of the MOSreset. The other end of the resistor Rreset is connected to the high-voltage side of the power supply HVcc for driving the upper arm. A Zener diode ZDreset for protection from an overvoltage is connected across the resistor Rreset.

In synchronization with the rise of an upper-arm driving signal from a microcomputer or the like, the logical circuit uses the upper-arm driving signal to generate a turn-on signal in pulse form in the high-withstand-voltage MOSset for turn-on signal transmission. In synchronization with the fall of the upper-arm driving signal, the logical circuit also generates a turn-on signal in pulse form in the high-withstand-voltage MOSreset for turn-off signal transmission. The two MOS's are used to transmit signals to the upper arm more rapidly and with less power consumption. The resistor Rset is further connected to the setting side of a flip-flop (FF), and the resistor Rreset is further connected to the resetting side of the FF. The driving signal that was decomposed into the rising pulse and the falling pulse by the logical circuit is restored at the FF to the same pulse width as that of the original driving signal from the microcomputer. The output of the FF is reversed in state by a NOT circuit, and when the command from the microcomputer is "H" (high), the output of the FF becomes "H" and thus the output of the NOT circuit becomes "L" (low). This turns on the HpMOS, supplies an electric current from the upper-arm driving power supply HVcc, and turns on the HIGBT, the IGBT for the upper arm.

SUMMARY OF THE INVENTION

Figure 3:
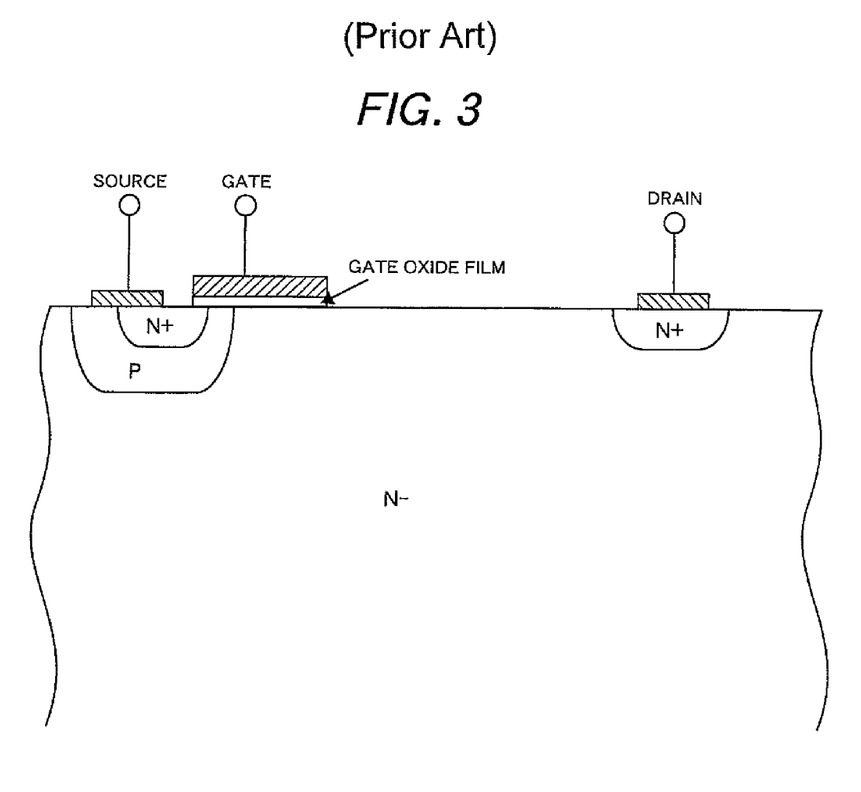
FIG. 3 is a cross-sectional explanatory diagram of a horizontal MOSFET based on the conventional technique.

FIG. 3 is a cross-sectional structural view showing the MOSset, the high-withstand-voltage MOS for turn-on signal transmission, and the MOSreset, the high-withstand-voltage MOS for turn-off signal transmission. Both are of a horizontal-type high-withstand-voltage MOSFET structure with drain, source, and gate electrodes on the same plane. As the voltage between the grounding terminals of the upper and lower arms is increased, the high-withstand-voltage MOSset for turn-on signal transmission and the high-withstand-voltage MOSreset for turn-off signal transmission are required to withstand higher voltages. To implement this, it is necessary to lower the concentration of impurities in the $n^-$ layer of the MOSFET and to extend the distance between the drain and the source. Consequently, the resistance of the $n^-$ layer increases and this, in turn, increases turn-on resistance. The increase in turn-on resistance correspondingly reduces the voltages developed at the setting resistor and the resetting resistor.

During motor driving, when there is a reflux of a current through the diode for the lower arm, the voltage between the upper and lower arms causes the grounding voltage of the upper arm to decrease below that of the lower arm according to the particular forward voltage decrement VF of the diode. At this time, the voltage applied to the level-shifting circuit becomes equal to the voltage obtained by subtracting the forward voltage decrement VF of the diode from the voltage of the power supply HVcc for driving the upper arm. If the forward voltage decrement VF of the diode is significant, this correspondingly reduces the voltages developed at the setting resistor and the resetting resistor and thus makes it impossible to turn the upper arm back on. Higher withstand voltage of the diode causes a more significant forward voltage decrement VF thereof. That is to say, as the voltage between the grounding terminals of the upper and lower arms increases, the voltages developed at the setting resistor and the resetting resistor will decrease, making it impossible to turn the upper arm back on.

Figure 4:
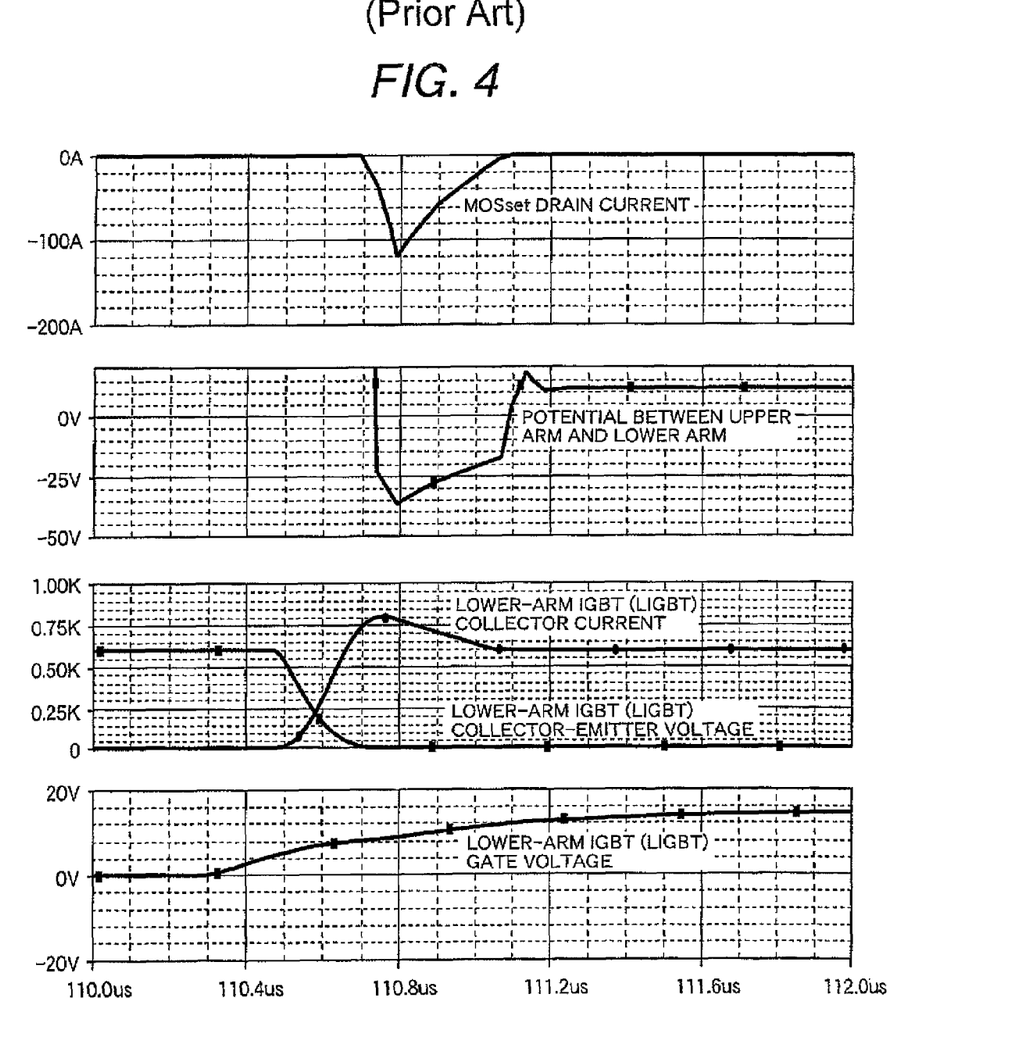
FIG. 4 is an explanatory diagram of the simulation waveforms obtained by simulating the turn-on of the lower-arm IGBT of the motor drive based on the conventional technique.
Figure 5:
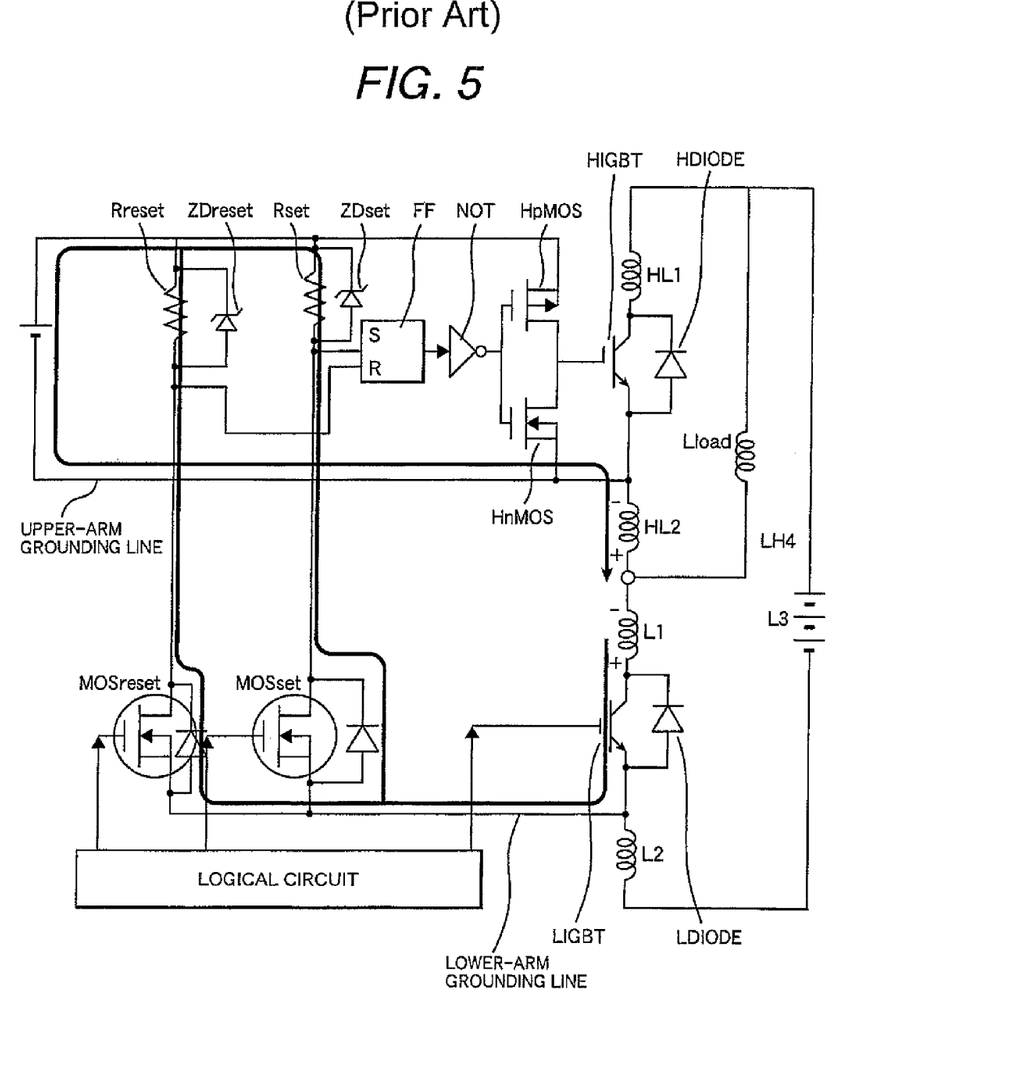
FIG. 5 is an explanatory diagram of electric current paths in a level-shifting circuit during the simulation in FIG. 3.

The waveforms of various sections of the lower-arm IGBT existing during simulation of its turn-back-on in the conventional technique are shown in FIG. 4. When the gate voltage of the lower-arm IGBT exceeds a threshold level, an electric current starts to flow into the lower-arm IGBT. At the same time, the lower-arm IGBT decreases in collector-emitter voltage. The recovery current of the upper-arm diode HDIODE maximizes the current flowing through the lower-arm IGBT. Voltage AVI is caused by a time change dI1/dt from the maximum value of the current to a steady current, and by the value of the wiring L1. Also, voltage ΔV2 is caused by a decrement dI2/dt in the recovery current of the upper-arm IGBT, and by the value of the wiring HL2. The sum of the voltages, ΔV1+ΔV2, is developed between the grounding terminals of the upper arm and the lower arm. This voltage is a potential lower at the grounding terminal of the upper arm than at that of the lower arm. If the developed voltage ΔV1+ΔV2 is higher than the power supply voltage HVcc of the upper arm, an overcurrent flows from the parasitic diodes of the high-withstand-voltage MOSset for turn-on signal transmission, and of the high-withstand-voltage MOSreset for turn-off signal transmission, through the Zener diodes. This state is shown in FIG. 5. The simulation waveforms in FIG. 4 indicate that there is a peak current flow of 100 A and thus that a significant loss is likely to occur.

An object of the present invention is to provide a motor drive adapted to operate stably and suffer essentially no damage, even when a high voltage is applied between grounding terminals of upper and lower arms.

In order to achieve the above object, the motor drive of the present invention uses insulated-gate bipolar transistors (IGBTs) as high-withstand-voltage elements for signal transmission.

The motor drive of the present invention can prevent voltages on a setting resistor and a resetting resistor from decreasing, even when a high voltage is applied between the grounding terminals of the upper and lower arms, that is, even when the high-withstand-voltage elements for signal transmission are impressed with a high voltage. In addition, when there is a reflux of a current through a diode for the lower arm, pulses can be accurately transmitted from the lower arm to the upper arm, even if a large current flows.

DESCRIPTION OF THE PREFERRED EMBODIMENTS

Details of the present invention will be described hereunder with reference being made to the accompanying drawings.

First Embodiment

Figure 1:
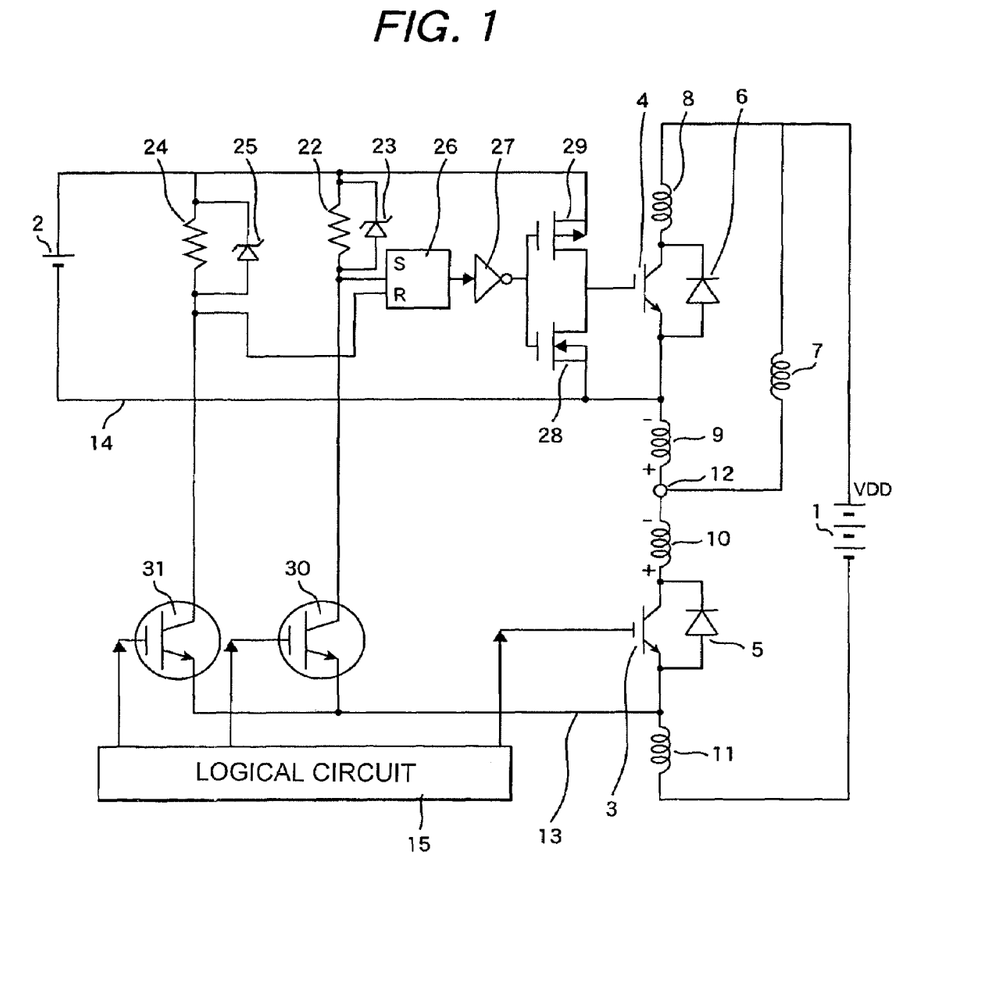
FIG. 1 is a circuit diagram of a motor drive according to a first embodiment.

A motor drive for driving one arm according to a first embodiment is shown in FIG. 1. As shown in FIG. 1, a high-voltage terminal of a main power supply 1 and a collector of an IGBT for an upper arm are connected via wiring 8. An emitter of the upper-arm IGBT 4 and an output terminal 12 of the main power supply 1 are connected via wiring 9. A collector of a lower-arm IGBT and the output terminal 12 are connected via wiring 10. A grounding terminal of the main power supply 1 and an emitter of the lower-arm IGBT 3 are connected via wiring 11. A diode 6 is connected in antiparallel between the collector and emitter of the upper-arm IGBT 4. A diode 5 is also connected in antiparallel across the lower-arm IGBT 3. A load inductance element 7 is connected between the high-voltage terminal and output terminal 12 of the main power supply 1. A driving circuit constructed of an nMOS 28 and a pMOS 29 is connected to a gate terminal of the upper-arm IGBT 4.

An IGBT 30 for turn-on signal transmission has an emitter connected to a grounding terminal 13 of the lower arm, a gate connected to a logical circuit 15, and a collector connected to one terminal of a resistor 22. The other terminal of the resistor 22 is connected to a high-voltage terminal of a power supply 2 connected to a grounding terminal 14 of the upper arm. A Zener diode 23 for protection from an overvoltage is connected across the resistor 22.

An IGBT 31 for turn-off signal transmission also has an emitter connected to the grounding terminal 13 of the lower arm, a gate connected to the logical circuit 15, and a collector connected to one terminal of a resistor 24. The other terminal of the resistor 24 is connected to the high-voltage terminal of the power supply 2 for driving the upper arm. A Zener diode 25 for protection from an overvoltage is connected across the resistor 24. An output of the resistor 22 is connected to a setting terminal of a non-reversal flip-flop 26, and an output of the resistor 24 is connected to a resetting terminal of the non-reversal flip-flop 26.

The output of the flip-flop has a connected NOT circuit 27, which is further connected between gates of the nMOS 28, pMOS 29. The nMOS 28 has a source connected to the grounding terminal 14 of the upper arm, and a drain connected to the gate of the IGBT 4 for the upper arm. The pMOS 29 has a source connected to the high-voltage terminal of the power supply 2 for driving the upper arm, and has a drain connected to the gate of the IGBT 4 for the upper arm.

Operation of the present embodiment is described below using FIG. 1. In synchronization with a rise of an upper-arm driving signal from a microcomputer or the like, the logical circuit 15 uses the upper-arm driving signal to generate a turn-on signal in pulse form in the IGBT 30 for turn-on signal transmission. In synchronization with a fall of the upper-arm driving signal, the logical circuit 15 also develops a turn-on signal in pulse form at the gate of the IGBT 31 for turn-off signal transmission. When the IGBT 30 for turn-on signal transmission is turned on, a voltage is developed between both terminals of the resistor 22, thus setting the output terminal of the non-reversal flip-flop 26 to an "H" (high) level. The "H" output of the non-reversal flip-flop 26 is reversed by the NOT circuit 27 to become an "L" (low) level. As a result, the pMOS 29 is turned on, an electric current is supplied from the high-voltage power supply to the IGBT 4 for the upper arm, and the IGBT 4 is turned on.

In synchronization with the fall of the upper-arm driving signal, the logical circuit 15 also develops a turn-on signal in pulse form at the gate of the IGBT 31 for turn-off signal transmission. When the IGBT 31 for turn-off signal transmission is turned on, a voltage is developed between both terminals of the resistor 24, thus setting the output terminal of the non-reversal flip-flop 26 to the "L" level, turning on the nMOS 28, and removing a charge from the gate of the upper-arm IGBT 4 to turn off the IGBT 4. In this way, the driving signal that was decomposed into the rising pulse and the falling pulse by the logical circuit 15 is restored at the upper arm to have the same pulse width as that of the original driving signal from the microcomputer.

Even when a high voltage is applied between the grounding terminals of the upper and lower arms, that is, even when the high-withstand-voltage elements for signal transmission are impressed with a high voltage, the use of the IGBTs as the high-withstand-voltage elements makes it possible to prevent voltages on the setting resistor and the resetting resistor from decreasing, since turn-on resistance of the IGBTs is low in comparison with that of the MOSFETs. Additionally, when there is a reflux of a current through the diode for the lower arm, even if the voltage between the upper and lower arms causes a grounding voltage of the upper arm to decrease below that of the lower arm according to a particular forward voltage drop VF of the diode, that is, if a significant VF causes a flow of a large current, pulses can be accurately transmitted from the lower arm to the upper arm since the turn-on resistance of the IGBTs is lower.

Furthermore, since both IGBTs are constructed so that even when the voltage on the collector decreases below that of the emitter, p-layer and $n^-$ layer formed at the collector side become reverse-biased, no current flows through the built-in diode of the MOSFET. Accordingly, even when wiring increases the grounding voltage of the lower arm above that of the upper arm, no current flows from the grounding terminal of the lower arm to that of the upper arm, whereby damage to the IC can be avoided.

Second Embodiment

Figure 6:
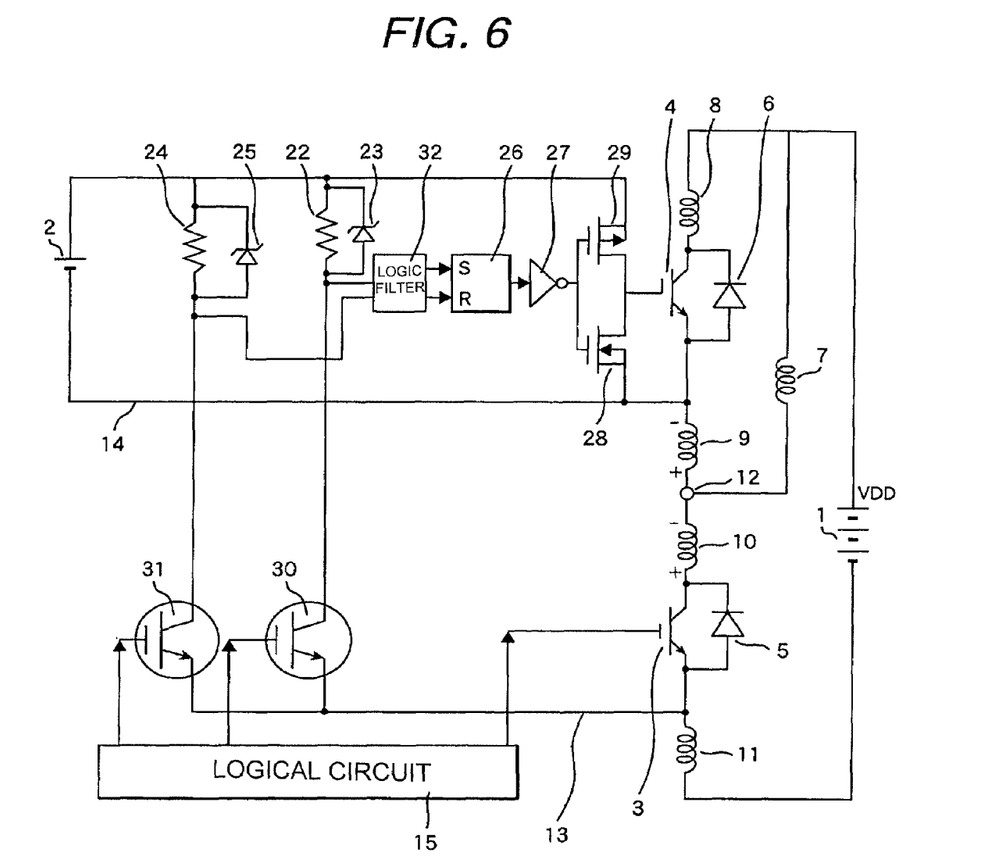
FIG. 6 is a circuit diagram of a motor drive according to a second embodiment.

A second embodiment is shown in FIG. 6. In the present embodiment, outputs of resistors 22 and 24 for level shifting are input to a logic filter 32, and an output of the logic filter 32 is further input to a setting side and resetting side of an RS flip-flop 26. The logic filter 32 outputs a signal only when a signal is input from either the setting or resetting side, and does not output a signal when signals are input from both the setting and resetting sides at the same time. Compared with MOSFETs, IGBTs have carriers stored in great quantities in respective $n^-$ layers, so the IGBTs tend to delay in turn-off and thus create a flow of a tail current. This tail current is likely to cause a signal at the setting side as well to which a signal is originally not applied by the tail current of the associated IGBT even when a selector signal is applied from the setting side to the resetting side. If signals are input from both the setting and resetting sides to the RS flip-flop 26, this flip-flop is likely to float in state and fail to turn off, for example. The logic filter prevents signals from occurring at both the setting and resetting sides at the same time, and thus makes it possible to prevent the RS flip-flop from floating in state and hence resulting in malfunction.

Figure 7:
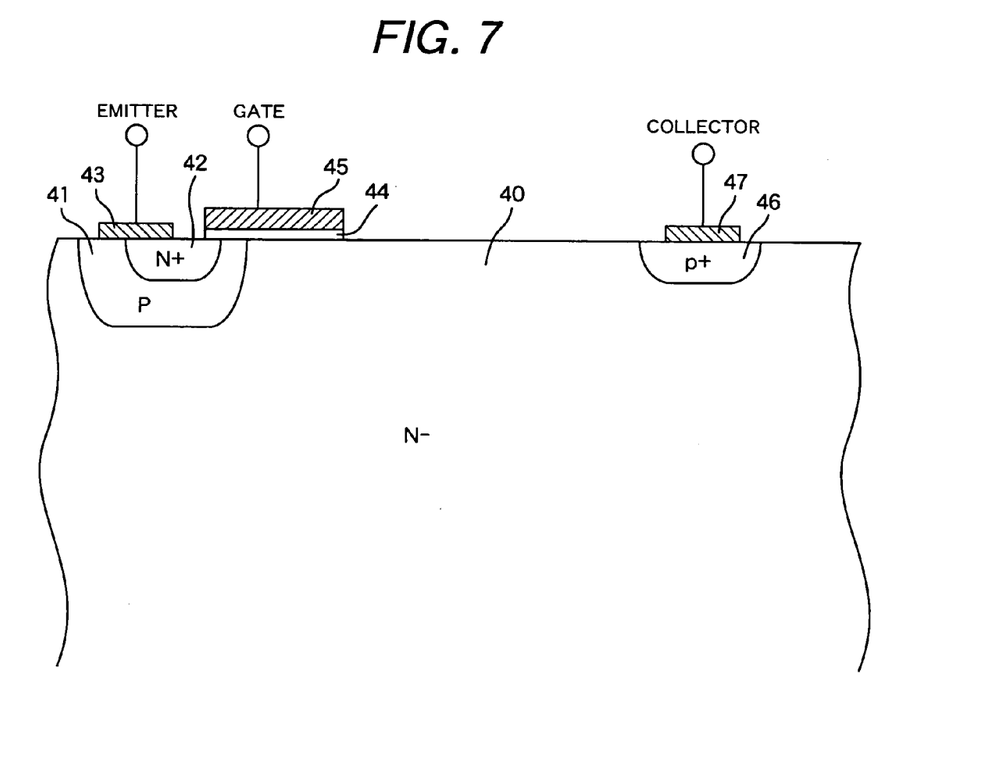
FIG. 7 is a sectional view of a high-withstand-voltage IGBT for signal transmission in the second embodiment.

A cross-sectional structure of a signal transmission high-withstand-voltage IGBT used in the present embodiment is shown in FIG. 7. The IGBT shown therein is of a horizontal IGBT structure with an emitter electrode, a collector electrode, and a gate electrode formed on the same plane. The IGBT also includes a p-layer 41 in an $n^-$ layer 40, and further includes an n+layer 42 in the p-layer 41. The p-layer 41 and the $n^+$ layer 42 are electrically strapped via the emitter electrode 43. Additionally, the IGBT has a gate oxide film 44 formed on the surface of an associated substrate, spanning the $n^+$ layer 42, the p-layer 41, and the $n^-$ layer 42, and further has the gate electrode 45 on the gate oxide film. Furthermore, a p+layer 46 is provided apart from the p-layer 41, inside the $n^-$ layer 40.

Figure 8:
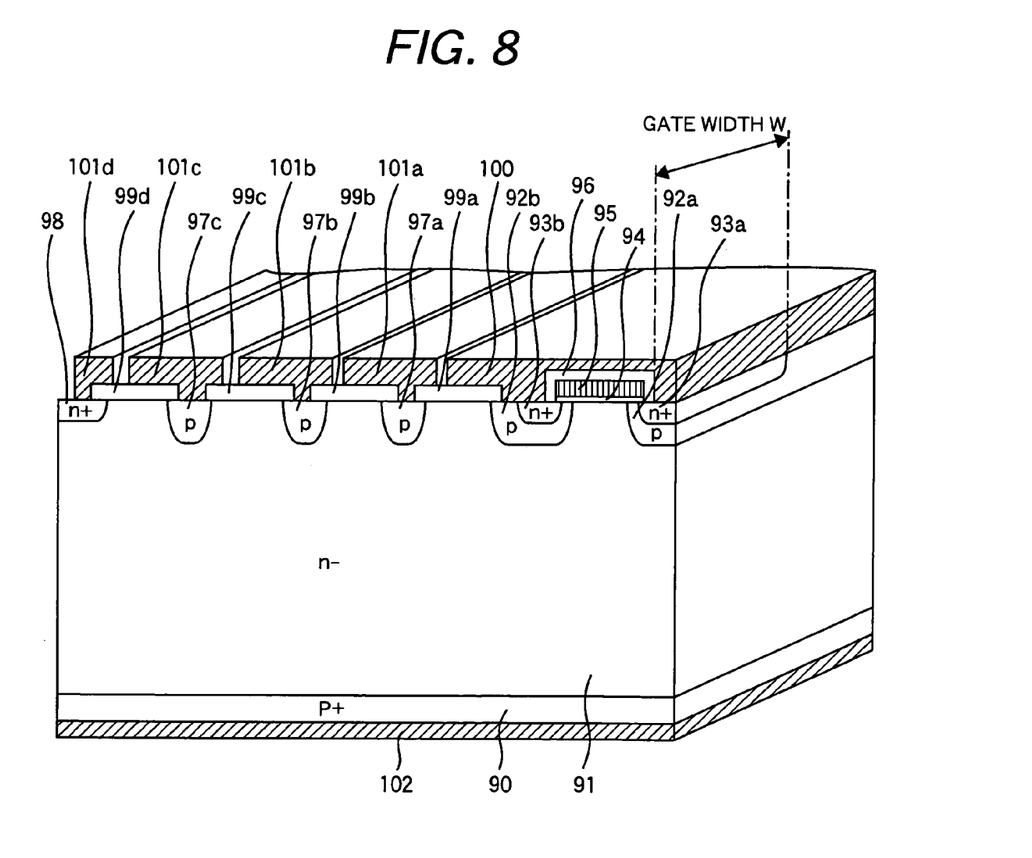
FIG. 8 is a perspective view of another high-withstand-voltage IGBT for signal transmission in the second embodiment.

Using an another IGBT shown in FIG. 8, in lieu of the IGBT in FIG. 7, makes it possible to enhance breakdown yield strength. A perspective view of a vertical IGBT used in the present embodiment is shown in FIG. 8. As shown therein, an $n^-$ layer 91 is formed on a $p^+$ layer 90, and p-layers 92a and 92b are formed in the $n^-$ layer 91. Also, an $n^+$ layer 93a is formed in the p-layer 92a, an $n^+$ layer 93b in the p-layer 92b, and a gate oxide film 94 on the surface of an associated substrate, spanning the $n^+$ layer 93a, the p-layer 92a, the $n^-$ layer 91, the p-layer 92b, and the $n^+$ layer 93b. In addition, a gate electrode 95 is formed on the gate oxide film 94. The p-layers 92a, 92b, the n+layers 93a, 93b, the gate oxide film 94, and the gate electrode 95 constitute a MOSFET. The p-layers 92a, 92b and the $n^+$ layers 93a, 93b are ohmically connected to a source electrode 96. In addition, p-layers 97a, 97b, 97c are formed in the $n^-$ layer 91, and an oxide film 99a is provided spanning the p-layer 92b, the $n^-$ layer 91, and the p-layer 97a. An oxide film 99b is provided spanning the p-layer 97a, the $n^-$ layer 91, and the p-layer 97b. An oxide film 99c is provided spanning the p-layer 97b, the $n^-$ layer 91, and the p-layer 97c. An oxide film 99d is provided spanning the p-layer 97c, the $n^-$ layer 91, and the p-layer 97c. An emitter electrode 100 extends in a direction of an $n^+$ layer 98, on the oxide film 99a. A floating electrode 101a ohmically connected to the p-layer 97a extends in the direction of the n+layer 98, on the oxide film 99b. A floating electrode 101b ohmically connected to the p-layer 97b extends in the direction of the $n^+$ layer 98, on the oxide film 99c. A floating electrode 101c ohmically connected to the p-layer 97c extends in the direction of the $n^+$ layer 98, on the oxide film 99d. A floating electrode 101d ohmically connected to the $n^+$ layer 98 extends in a direction of the $n^+$ layer 98. A collector electrode 102 is ohmically connected to an $p^+$ layer 90.

The IGBT in the present embodiment operates as follows. That is to say, with the emitter electrode in a grounded condition and the collector electrode impressed with a high voltage, a positive voltage is applied to the gate electrode. The p-layers 92a, 92b are then electrically reversed. This, in turn, creates a channel, causes electrons to flow into the $n^-$ layer 91 through the channel, and further makes the electrons flow through the $p^+$ layer 102 and reach the collector electrode 102. Since holes are injected from the $p^+$ layer 102 into the $n^-$ layer 91 of high resistance, the resistance of the $n^-$ layer 91 is reduced and thus the IGBT can make turn-off resistance lower than that of the MOSFET. A hole current can reach the emitter electrode without flowing through the p-layer 92 located below the n+ layer 93, so breakdown yield strength can be raised above that of the horizontal IGBT.

Also, the emitter electrode 100, the floating electrode 101a, the floating electrode 101b, and the floating electrode 101c are extended in the direction of the n+ layer 98 to prolong a depletion layer for increased withstand voltage. Since an end has its cutting plane exposed to the surface, a large number of recombination levels occur and when the depletion layer reaches the end, current leakage increases. The n+ layer 98 and the electrode 102 prevent the n− layer from being reversed to a p-type by internal charges of the oxide films 99a, 99b, 99c, 99d, and by an internal charge of a protective film not shown, and thus prevent the depletion layer from reaching the end. Increasing a resistivity and thickness of the n− layer 91 and the number of p-layers 97a, 97b, 97c makes it possible to easily obtain a greater voltage-withstanding capability without changing a manufacturing method. The thickness of the n− layer 91 is desirably such that this layer is not depleted at a rated voltage of an associated element. More specifically, when, with the rated voltage taken as V, an impurity concentration in the n− layer is expressed as N (n−), a relative dielectric constant of silicon as $\epsilon Si$, a dielectric constant of vacuum as $\epsilon 0$, and an elementary charge as q, the thickness of the n− layer, d (n−), desirably satisfies the following expression:

$$d(n^-) > \sqrt{[2 \times \epsilon 0 \times \epsilon Si \times V / (q \times N(n^-))]}$$

In addition, although higher concentration of the p+ layer 90 reduces turn-on resistance more significantly, since the hole-current concentration in the n− layer 91 during turn-on correspondingly increases, breakdown becomes more prone to occur. When a signal is transmitted from a lower arm to an upper arm, a saturation current limited by the IGBT flows while a power supply voltage is being applied. Accordingly, although for a brief time, a significant loss occurs, so to prevent this, it is desirable that a peak concentration in the p+ layer 90 be $1 \times 10^{18}/cm^3$ or less.

Figure 9:
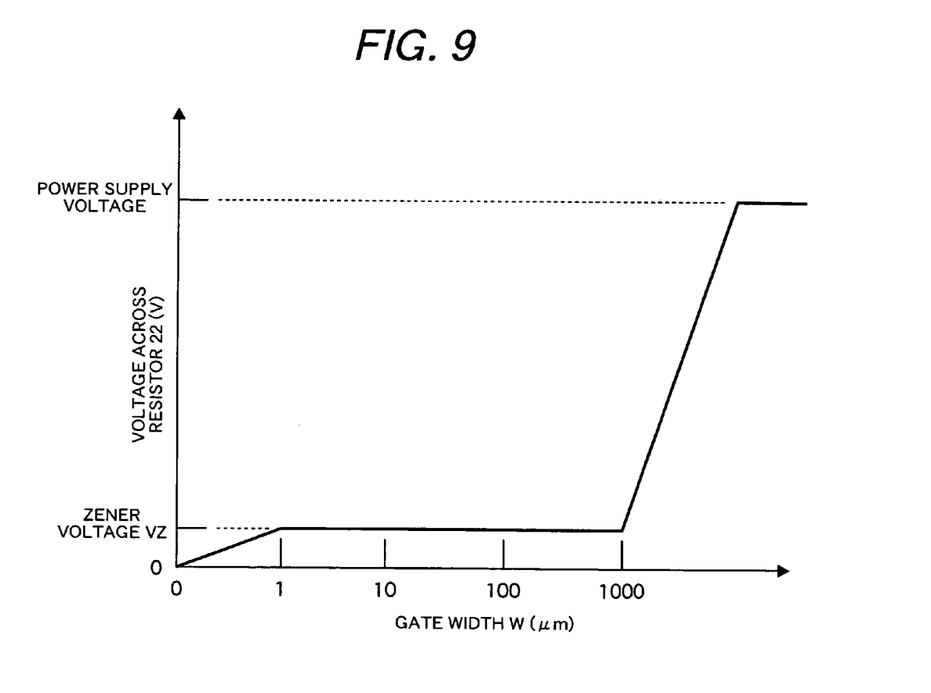
FIG. 9 is an explanatory diagram of a relationship between gate width of the high-withstand-voltage IGBT for signal transmission in the second embodiment, and a voltage across a resistor 22.

FIG. 9 shows a relationship between gate width (at progressively, horizontally rearward positions in FIG. 7) of the high-withstand-voltage IGBT for signal transmission, shown in FIG. 8, and a voltage across a resistor 22. When the gate width is 0, since no current flows, no voltage is developed across the resistor 22. Increasing the gate width increases the amount of current flowing, and hence also increases the voltage across the resistor 22. If a Zener diode 23 is connected to the resistor 22, even when the gate width is increased for a greater amount of current, the voltage across the resistor is suppressed by a Zener voltage and stops increasing. At a gate width of 10,000 μm or more, however, the voltage across the resistor restarts to increase. This is because the Zener diode that can be integrated into an IC chip has a large quantity of resistive components, and thus because the increase in the current results in increased voltage drop. If the resistor 22 is reduced in resistance value, although the voltage across the resistor is suppressed, a loss rate increases since a greater amount of current flows. For this reason, reducing the resistance value of the resistor 22 is not desirable. For use at a voltage defined by the Zener voltage, the gate width is desirably 1,000 μm or less. In addition, in voltage regions below the Zener voltage, changes in current, caused by manufacturing-associated nonuniformity of quality and/or by temperature changes, vary a voltage across a resistor 32. A minimum value of the gate width, therefore, is more desirably 11 μm.

Figure 10:
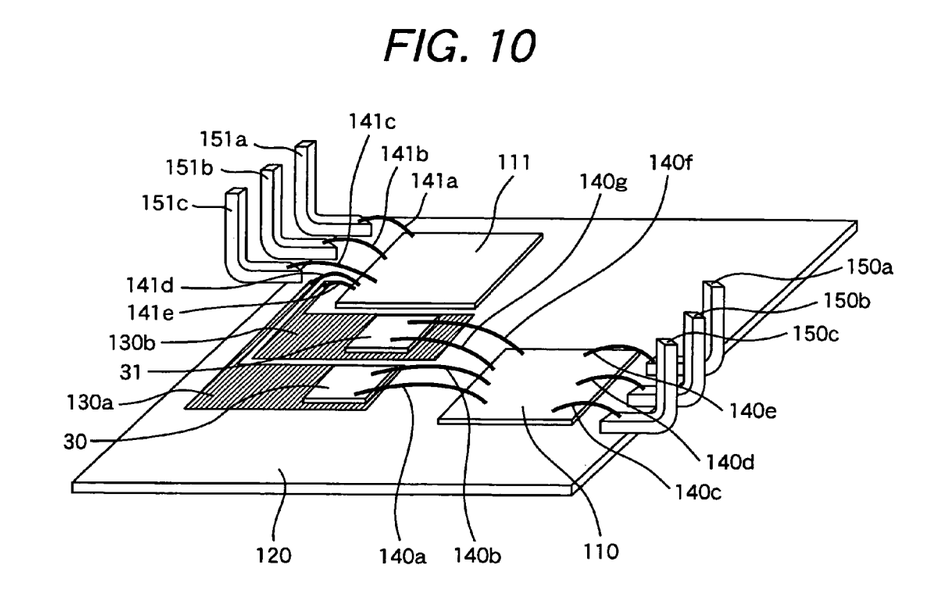
FIG. 10 is a mounting diagram of an inverter-driving circuit including the IGBT of FIG. 8.

FIG. 10 shows a mounting state of an inverter control circuit with a level-shifting circuit which uses the signal transmission high-withstand-voltage IGBT shown in FIG. 8. In the present embodiment, four IC chips are arranged on an insulating substrate 120. One is a lower-arm IC chip 110 including an lower-arm driving circuit and a logical circuit 15, one is an upper-arm IC chip 111 with resistors 24, 25, Zener diodes 23, 25, a non-reversal flip-flop 26, an nMOS 28, and a pMOS 29, one is an IGBT 30 for turn-on signal transmission, and one is an IGBT 31 for turn-off signal transmission. The IC chip 110 is connected to not only the IGBT 30 for turn-on signal transmission and the IGBT 31 for turn-off signal transmission, but also output terminals 150, via bonded wires 140. In addition, the IC chip 111 is connected to not only the IGBT 30 for turn-on signal transmission and the IGBT 31 for turn-off signal transmission, but also output terminals 151, via bonded wires 141. A collector of the IGBT 30 for turn-on signal transmission, and a collector of the IGBT 31 for turn-off signal transmission are connected to the insulating substrate 120 through wiring 130 formed thereon, and are further connected to the IC chip 111 via other bonded wires 140.

The high-withstand-voltage IGBT for signal transmission, shown in FIG. 8, is difficult to integrate into a single chip, since the emitter and the gate are formed on the surface and the collector on the reverse. In the present embodiment, a mounting area can be minimized by arranging the upper-arm IC chip 110, the lower-arm IC chip 111, and the two high-withstand-voltage IC chips for signal transmission, namely, IGBTs 30 and 31, on the insulating substrate. Additionally, the upper arm and the lower arm can easily be electrically insulated from each other since appropriate distances (at least 0.5 mm) are provided between the insulating substrate and the chips. Furthermore, the high-withstand-voltage IGBTs 30 and 31 for signal transmission are co-packaged with the upper-arm IC chip 110 and the lower-arm IC chip 111, in a state molded with an epoxy resin composition which contains an inorganic filler. Each chip is thus protected from any moisture entering from external regions. In the present embodiment, since the motor drive is constructed essentially of silicon and an insulated substrate in this way, the drive can be manufactured at low costs, compared with using a photocoupler. In addition, it is possible in the present embodiment to, by mounting the signal-transmitting high-withstand-voltage IGBTs in chips independent of the upper- and lower-arm chips, easily assign a great voltage-withstanding capability to the IGBTs without using a special process of integration into a single chip, and hence, manufacture the drive less expensively than by using an dielectric isolation substrate.

Figure 11:
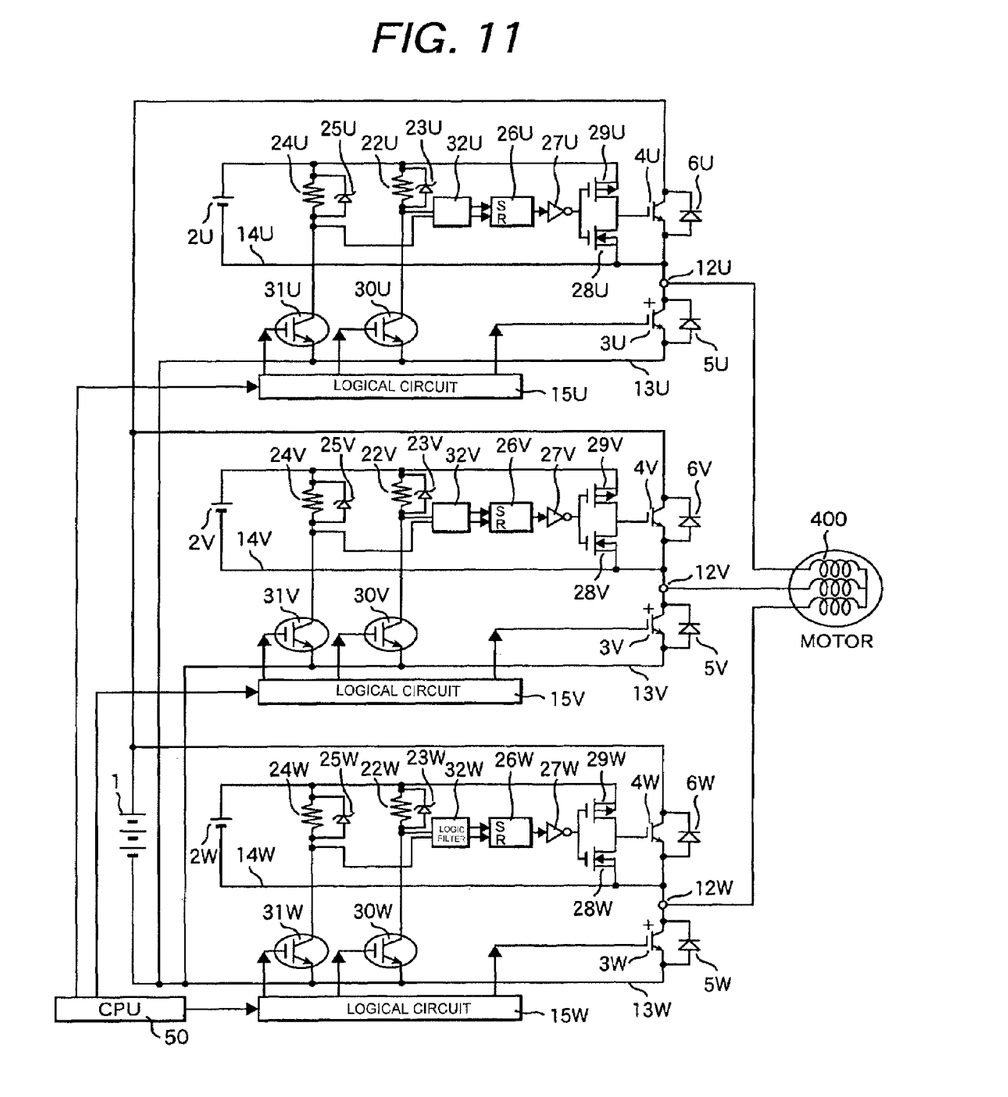
FIG. 11 is a circuit diagram of a three-phase AC motor drive based on the second embodiment.

FIG. 11 shows an example of circuit composition intended to drive a three-phase AC motor according to the present embodiment shown in FIG. 6. A driving power supply for a lower arm is common to phases U, V, and W. For an upper arm, an independent driving power supply is used for phases U, V, and W each. Main power supply voltage terminals and grounding terminals for both arms are also common to phases U, V, W. Commands from a microcomputer 50 activate logical circuits 15U, 15V, 15W to turn power-switching elements (IGBTs) of each phase on and off, thereby to control rotation of a motor 400.

No current is induced into the IGBTs until respective p-n junctions have been forward-biased. Accordingly, no current flows until a built-in voltage has been reached (for silicon, approx. 0.8 V). The IGBTs are therefore disadvantageous against MOSFETs in which a current begins to flow at that voltage of 0 V. Since IGBTs with element withstand voltages up to 250 V have the characteristics that no current flows at up to the above built-in voltage, these IGBTs are inferior to MOSFETs in current drivability. The present invention is therefore effective for IGBTs with a withstand voltage of at least 250 V. In addition, at a withstand voltage of at least 1,500 V that spreads the difference in current drivability between MOSFETs and the above IGBTs by a factor of 10 or more, the present invention does not operate in a level-shifting circuit based on MOSFETs, so the invention is desirably applied to IGBTs of at least 1,500 V in withstand voltage.

What is claimed is:

1. A motor drive comprising:

an arm which has an upper arm section and a lower arm section, the upper arm section includes a first electric power semiconductor-switching element and the lower arm section includes a second electric power semiconductor-switching element, both upper and lower arm sections and first and second electric power semiconductor-switching elements are connected in series between major terminals; and a level-shifting circuit which transmits a control signal of the first electric power semiconductor-switching element connected to a high-voltage side of the arm, from a low-voltage circuit to a high-voltage circuit;

wherein the motor drive has a circuit composition in which a difference between a grounding voltage of the lower arm section and a grounding voltage of the upper arm section is equal to $\Delta V1+\Delta V2$, generated by a change of current and a wiring inductance at a transitional period ON/OFF of the upper arm section first electric power semiconductor-switching element which exceeds an operating voltage HVcc of a control power supply for controlling the first electric power semiconductor-switching element of the upper arm section;

wherein $\Delta V1$ is a voltage change caused by a time change dI1/dt from a maximum value of a current in the lower arm second electric power semiconductor-switching element to a steady current and by a wiring inductance in the lower arm section;

wherein $\Delta V2$ is a voltage change caused by a decrement dI2/dt in a recovery current of the upper arm first electric power semiconductor-switching element and by a wiring inductance in the upper arm section; and wherein a signal-transmitting high-withstand-voltage element in the level-shifting circuit is an insulated-gate bipolar transistor.

2. The motor drive according to claim 1, further comprising in the level-shifting circuit:

a logic filter which shuts off signals if the signals are both input at the same time to setting-signal and resetting-signal transmission circuit elements of the level-shifting circuit.

3. The motor drive according to claim 1, wherein:

an insulated-gate bipolar transistor that is the signal-transmitting high-withstand-voltage element in the level-shifting circuit has both an emitter electrode and a gate electrode formed on a semiconductor substrate surface opposite to a semiconductor substrate surface which has a collector electrode.

4. The motor drive according to claim 3, wherein:

the insulated-gate bipolar transistor ranges from 1 μm to 1,000 μm in gate width.

5. The motor drive according to claim 3, wherein the insulated-gate bipolar transistor includes:

a first p-type semiconductor layer;

an $n^-$ layer which is a second semiconductor layer formed on the first p-type semiconductor layer;

a third p-type semiconductor layer formed in the $n^-$ layer which is the second semiconductor layer; and a fourth n-type semiconductor layer formed in the third semiconductor layer;

and wherein:

a gate electrode is disposed via an oxide film formed on an exposed section of the semiconductor substrate surface on which are formed the second semiconductor layer, the third semiconductor layer, and the third semiconductor layer;

a collector electrode is disposed abutting on the first semiconductor layer;

a source electrode is disposed abutting on both the third semiconductor layer and the fourth semiconductor layer; and the $n^-$ layer which is the second semiconductor layer is thicker than a depletion layer which spreads when a rated voltage is applied.

6. The motor drive according to claim 5, wherein:

when, with the insulated-gate bipolar transistor taken to have a rated voltage V, an impurity concentration in the $n_-$ layer which is the second semiconductor layer of the insulated-gate bipolar transistor is expressed as N ($n^-$), a relative dielectric constant of silicon as $\epsilon Si$, a dielectric constant of vacuum as $\epsilon 0$, and an elementary charge as q, thickness "d ($n^-$)" of the $n^-$ layer which is the second semiconductor layer of the insulated-gate bipolar transistor satisfies $$d(n^-) > \sqrt{[2 \times \epsilon 0 \times \epsilon Si \times V/(q \times N(n^-))]}.$$

7. The motor drive according to claim 5, wherein:

the insulated-gate bipolar transistor is equal to or less than $1 \times 10^{18}/cm^3$ in terms of peak concentration of a $p^+$ layer which is the first semiconductor layer on which the collector abuts.

8. The motor drive according to claim 5, wherein:

an upper-arm section IC, a lower-arm section IC, and the high-withstand-voltage IGBT for signal transmission are each formed in an independent semiconductor chip.

9. The motor drive according to claim 8, wherein:

the upper-arm section IC, the lower-arm section IC, and the high-withstand-voltage IGBT for signal transmission are all molded in one package.

10. The motor drive according to claim 8, wherein:

the first and the second electric power semiconductor-switching element for motor control has a withstand voltage equal to or greater than 1,500 V.

11. A motor drive with three arms each including a first IGBT and a second IGBT, both connected in series between major terminals, the motor drive being adapted to drive a three-phase AC motor which is a load, the motor drive further comprising:

three level-shifting circuits each for transmitting a gate signal of the first IGBT connected to a high-voltage side of any one of the arms, from a low-voltage circuit to a high-voltage circuit;

wherein each arm has an upper arm section and a lower arm section, wherein the first IGBT is located in the upper arm section and the second IGBT is located in the lower arm section, and the motor drive has a circuit composition in which a difference between a grounding voltage of the lower arm section and a grounding voltage of the upper arm section is equal to $\Delta V1+\Delta V2$ generated by a change of current and a wiring inductance at the transitional period ON/OFF of the first IGBT which exceeds an operating voltage HVcc of a control power supply for controlling the first IGBT of the upper arm section;

wherein $\Delta V1$ is a voltage change caused by a time change dI1/dt from a maximum value of a current in the lower arm second electric power semiconductor-switching element to a steady current and by a wiring inductance in the lower arm section;

wherein $\Delta V2$ is a voltage change caused by a decrement $dI2/dt$ in a recovery current of the upper arm first IGBT and by a wiring inductance in the upper arm section; and wherein:

a signal-transmitting high-withstand-voltage element of each of the three level-shifting circuits is an IGBT;

and wherein:

the signal-transmitting high-withstand-voltage IGBT includes a first p-type semiconductor layer;

an $n^-$ layer which is a second semiconductor layer formed on the first p-type semiconductor layer;

a third p-type semiconductor layer formed in the $n^-$ layer which is the second semiconductor layer; and a fourth n-type semiconductor layer formed in the third semiconductor layer;

and further wherein:

a gate electrode is disposed via an oxide film formed on an exposed section of the semiconductor substrate surface on which are formed the second semiconductor layer, the third semiconductor layer, and the third semiconductor layer;

a collector electrode is disposed abutting on the first semiconductor layer;

a source electrode is disposed abutting on both the third semiconductor layer and the fourth semiconductor layer; and the $n^-$ layer which is the second semiconductor layer is thicker than a depletion layer which spreads when a rated voltage is applied.

12. A motor drive with three arms each including a first IGBT and a second IGBT, both connected in series between major terminals, the motor drive being adapted to drive a three-phase AC motor which is a load, the motor drive further comprising:

three level-shifting circuits each for transmitting a gate signal of the first IGBT connected to a high-voltage side of any one of the arms, from a low-voltage circuit to a high-voltage circuit;

wherein each arm has an upper arm section and a lower arm section, wherein the first IGBT is located in the upper arm section and the second IGBT is located in the lower arm section, and the motor drive has a circuit composition in which a difference between a grounding voltage of the lower arm section and a grounding voltage of the upper section arm is equal to $\Delta V1+\Delta V2$ generated by a change of current and a wiring inductance at the transitional period ON/OFF of the first IGBT which exceeds an operating voltage HVcc of a control power supply for controlling the first IGBT of the upper arm section;

wherein $\Delta V1$ is a voltage caused by a time change $dI1/dt$ from a maximum value of a current in the lower arm second electric power semiconductor-switching element to a steady current and by a wiring inductance in the lower arm section;

wherein $\Delta V2$ is a voltage change caused by a decrement $dI2/dt$ in a recovery current of the upper arm first IGBT and by a wiring inductance in the upper arm section; and wherein:

a signal-transmitting high-withstand-voltage element of each of the three level-shifting circuits is an IGBT;

and wherein:

a semiconductor chip with the signal-transmitting high-withstand-voltage IGBT formed therein, and another semiconductor chip in which an arm-driving circuit and a logical circuit are formed constitute a semiconductor device mounted in a resin-molded condition in one package.

* * * * *